United States Patent
Lee et al.

(10) Patent No.: US 10,083,671 B2
(45) Date of Patent: Sep. 25, 2018

(54) DC-DC CONVERTER AND DISPLAY APPARATUS HAVING THE SAME

(71) Applicant: SAMSUNG DISPLAY CO., LTD., Yongin, Gyeonggi-Do (KR)

(72) Inventors: Jong-Jae Lee, Hwaseong-si (KR); Yang-Uk Nam, Seoul (KR); Jun-Ki Hong, Bucheon-si (KR); Jun-Dal Kim, Yongin-si (KR); Jang-Hee Park, Siheung-si (KR)

(73) Assignee: Samsung Display Co., Ltd., Yongin-Si, Gyeonggi-do (KR)

( * ) Notice: Subject to any disclaimer, the term of this patent is extended or adjusted under 35 U.S.C. 154(b) by 205 days.

(21) Appl. No.: 14/920,176

(22) Filed: Oct. 22, 2015

(65) Prior Publication Data
US 2016/0118875 A1 Apr. 28, 2016

(30) Foreign Application Priority Data
Oct. 23, 2014 (KR) ........................ 10-2014-0144511

(51) Int. Cl.
*G09G 5/00* (2006.01)
*H02M 1/08* (2006.01)
*H02M 3/156* (2006.01)
*H03K 17/16* (2006.01)
*H02M 1/00* (2006.01)

(52) U.S. Cl.
CPC ............... *G09G 5/00* (2013.01); *H02M 1/08* (2013.01); *H02M 3/156* (2013.01); *H03K 17/161* (2013.01); *G09G 2310/08* (2013.01); *G09G 2330/02* (2013.01); *G09G 2330/028* (2013.01); *H02M 2001/0029* (2013.01)

(58) Field of Classification Search
CPC ........... G09G 2310/08; G09G 2330/02; G09G 2330/028; G09G 5/00; H02M 1/08; H02M 2001/0029; H02M 3/156; H03K 17/161
See application file for complete search history.

(56) References Cited

U.S. PATENT DOCUMENTS

| | | | |
|---|---|---|---|
| 5,636,114 A | 6/1997 | Bhagwat et al. | |
| 6,335,638 B1 | 1/2002 | Kwong et al. | |
| 6,434,029 B1 | 8/2002 | Cyr et al. | |
| 7,190,225 B2 | 3/2007 | Edwards | |
| 2003/0147264 A1 | 8/2003 | Jinno | |
| 2007/0096703 A1* | 5/2007 | Jain ...................... | H02M 3/158 323/282 |
| 2007/0096704 A1* | 5/2007 | Jain ...................... | H02M 3/157 323/282 |

(Continued)

FOREIGN PATENT DOCUMENTS

| | | |
|---|---|---|
| JP | 2005-165604 A | 6/2005 |
| JP | 2011-078193 A | 4/2011 |

(Continued)

*Primary Examiner* — Dmitriy Bolotin
(74) *Attorney, Agent, or Firm* — Lee & Morse, P.C.

(57) ABSTRACT

A DC-DC converter includes a power switch and a switching controller. The power switch is repetitively turned on and off for generating an output DC voltage based on an input DC voltage. The switching controller controls operation of the power switch, and includes a slew rate controller to adjust a slew rate of a switch voltage of an electrode of the power switch to vary with time.

20 Claims, 10 Drawing Sheets

(56) References Cited

U.S. PATENT DOCUMENTS

| | | | |
|---|---|---|---|
| 2007/0103136 A1* | 5/2007 | Jain | G06F 1/26 |
| | | | 323/282 |
| 2008/0157742 A1* | 7/2008 | Martin | H02M 3/1584 |
| | | | 323/284 |
| 2008/0157743 A1* | 7/2008 | Martin | H02M 3/1584 |
| | | | 323/284 |
| 2009/0174262 A1* | 7/2009 | Martin | H02M 3/157 |
| | | | 307/82 |
| 2010/0253305 A1 | 10/2010 | Melanson et al. | |
| 2013/0077364 A1* | 3/2013 | Urienza | H02M 7/2176 |
| | | | 363/84 |
| 2014/0159687 A1* | 6/2014 | Lee | H02M 3/1588 |
| | | | 323/282 |
| 2015/0022562 A1* | 1/2015 | Tsubakino | G09G 3/3275 |
| | | | 345/690 |

FOREIGN PATENT DOCUMENTS

| | | |
|---|---|---|
| JP | 2013-150453 A | 8/2013 |
| KR | 10-2010-0022959 A | 3/2010 |
| KR | 10-2013-0109967 A | 10/2013 |

* cited by examiner

DC-DC CONVERTER AND DISPLAY APPARATUS HAVING THE SAME

CROSS-REFERENCE TO RELATED APPLICATION

Korean Patent Application No. 10-2014-0144511, filed on Oct. 23, 2014, and entitled, "DC-DC Converter And Display Apparatus Having The Same," is incorporated by reference herein in its entirety.

BACKGROUND

1. Field

One or more embodiments described herein relate to a DC-DC converter and a display apparatus including a DC-DC converter.

2. Description of the Related Art

A DC-DC converter may experience broadband power noise caused by various influences. For example, rising noise and falling noise may occur when a switch of the DC-DC converter is turned on and off.

Various attempts have been made to offset this noise. For example, a snubber circuit may be connected to ends of the switch. Such a circuit might reduce the amplitude of a ring waveform generated when the switch turned on and off. However, the snubber circuit increases the number of elements of the converter and thus the efficiency of the DC-DC converter may be reduced.

SUMMARY

In accordance with one or more embodiments, a DC-DC converter includes a power switch to be repetitively turned on and off to generate an output DC voltage based on an input DC voltage; and a switching controller to control operation of the power switch, wherein the switching controller includes a slew rate controller to adjust a slew rate of a switch voltage of an electrode of the power switch to vary with time.

The switching controller may include a switch gate driver to adjust a level of a first voltage having a first cycle to generate a second voltage having the first cycle. The slew rate of the switch voltage may decrease with an increase in a resistance of a resistor of the slew rate controller which connects the switch gate driver to the power switch.

The slew rate controller may include N resistors connected one another in parallel, and the N resistors may sequentially connect the switch gate driver to the power switch by N switches respectively connected to the N resistors, where N being a positive integer. The N resistors may have different resistances.

First to N-th switches of the slew rate controller may be sequentially turned on, and, after the N-th switch is turned on, the first switch of the slew rate controller may be turned on, wherein a slew rate changing cycle may correspond to time from a moment when the first switch is turned on to a moment when the first switch is turned on again, and the slew rate changing cycle may be greater than the first cycle by N times.

First to N-th switches of the slew rate controller may be sequentially turned on, and, after the N-th switch is turned on, (N−1)-th to the first switches of the slew rate controller may be sequentially turned on, wherein a slew rate changing cycle may correspond to a time from a moment when the first switch is turned on to a moment when the first switch is turned on again, and the slew rate changing cycle maybe greater than the first cycle by 2N−2 times.

A first switch of the slew rate controller may be turned on based on a rising edge of a first pulse of the first voltage, and a second switch of the slew rate controller maybe turned on based on a rising edge of a second pulse of the first voltage.

A first switch of the slew rate controller may be turned on based on a rising edge of a first pulse of the first voltage, and a second switch of the slew rate controller maybe turned on based on a falling edge of the first pulse of the first voltage.

A first switch group including switches may be turned on based on rising edges of pulses of the first voltage has a first turn-on repeating cycle, a second switch group including switches may be turned on based on falling edges of pulses of the first voltage has a second turn-on repeating cycle, and the first turn-on repeating cycle may be different from the second turn-on repeating cycle.

The switch gate driver may include a first switch, a second switch, and a third switch, the first switch may include a control electrode to which the first voltage is applied, an input electrode connected to a control electrode of the second switching element, and an output electrode to which a second DC voltage of a low level is applied, the second switch may include the control electrode connected to the input electrode of the first switch, an input electrode to which a first DC voltage of a high level is applied, and an output electrode connected to an input electrode of the third switch, and the third switch may include a control electrode connected to the input electrode of the first switch, the input electrode connected to the output electrode of the second switch, and an output electrode to which the second DC voltage is applied.

The slew rate controller may generate a variable power voltage having various levels according to an input signal. The slew rate controller may include a digital-to-analog converter to receive the input signal and to generate an input analog signal; an amplifier connected to the digital to analog converter; and a fourth switch connected to the amplifier. The slew rate of the switch voltage may increase as the variable power voltage increases.

The variable power voltage may sequentially decreases from a first level to an N-th level, and, after the level of the variable power voltage reaches the N-th level, the level of the variable power voltage may increase to the first level, wherein a slew rate changing cycle may correspond to a time from a moment when the variable power voltage is on the first level to a moment when the variable power voltage is on the first level again after decreasing to the N-th level, and the slew rate changing cycle may be greater than the first cycle by N times.

The variable power voltage may sequentially decrease from a first level to an N-th level, and, after the level of the variable power voltage reaches the N-th level, the level of the variable power voltage sequentially may increase from an (N−1)-th level to the first level, wherein a slew rate changing cycle may correspond to a time from a moment when the variable power voltage is on the first level to a moment when the variable power voltage is on the first level again after decreasing to the N-th level, and the slew rate changing cycle may be greater than the first cycle by 2N−2 times.

The switch gate driver may include a first switch, a second switch, and a third switch, the first switch may include a control electrode to which the first voltage is applied, an input electrode to which the variable power voltage is applied, and an output electrode to which a second DC voltage of a first level is applied, the second switch may include a control electrode connected to the input electrode of the first switch, an input electrode to which a first DC voltage of a second level is applied, and an output electrode connected to an input electrode of the third switching element, the second level higher than the first level, and the third switch may include a control electrode connected to the input electrode of the first switch, the input electrode connected to the output electrode of the second switch, and an output electrode to which the second DC voltage is applied.

In accordance with one or more other embodiments, a display apparatus includes a display panel to display an image; a DC-DC converter including a power switch and a switching controller, the power switch to be repetitively turned on and off to generate an output DC voltage based on an input DC voltage, and the switching controller to control operation of the power switch; and a display panel driver to drive the display panel based on the output DC voltage, wherein the switching controller includes a slew rate controller to adjust a slew rate of a switch voltage of an electrode of the power switch to vary with time.

The display panel driver may include a gate driver to output a gate signal to a gate line of the display panel, the output DC voltage of the DC-DC converter corresponding to a gate-on voltage. The display panel driver may include a data driver to output a data voltage to a data line of the display panel, and the output DC voltage of the DC-DC converter may correspond to an analog power voltage to generate the data voltage.

BRIEF DESCRIPTION OF THE DRAWINGS

Features will become apparent to those of skill in the art by describing in detail exemplary embodiments with reference to the attached drawings in which.

DETAILED DESCRIPTION

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. In the drawings, the dimensions of layers and regions may be exaggerated for clarity of illustration. Like reference numerals refer to like elements throughout.

Figure 1:
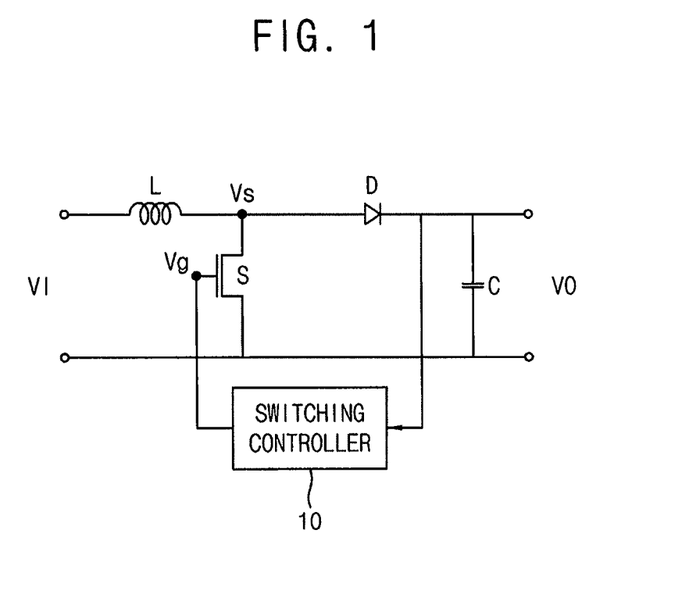
FIG. 1 illustrates an embodiment of a DC-DC converter.

FIG. 1 illustrates an embodiment of a DC-DC converter which includes a power switch S and a switching controller 10. The power switch S is repetitively turned on and off to generate an output DC voltage VO based on an input DC voltage VI. The switching controller 10 controls an operation of the power switch S. The output DV voltage VO may be, for example, greater than the input DC voltage VI.

The input DC voltage VI is a voltage between a first input terminal of the DC-DC converter and a second input terminal of the DC-DC converter. The output DC voltage VO is between a first output terminal of the DC-DC converter and a second output terminal of the DC-DC converter.

The inductor L has a first end connected to the first input terminal of the DC-DC converter and a second end connected to an input electrode of the power switch S. The power switch S has an output electrode connected to the second input terminal of the DC-DC converter, and a control electrode connected to the switching controller 10. The input electrode of the power switch S is connected an anode of a diode D. A cathode of the diode D is connected to the first output terminal.

The capacitor C has a first end connected to the first output terminal and a second end connected to the second output terminal.

Figure 2:
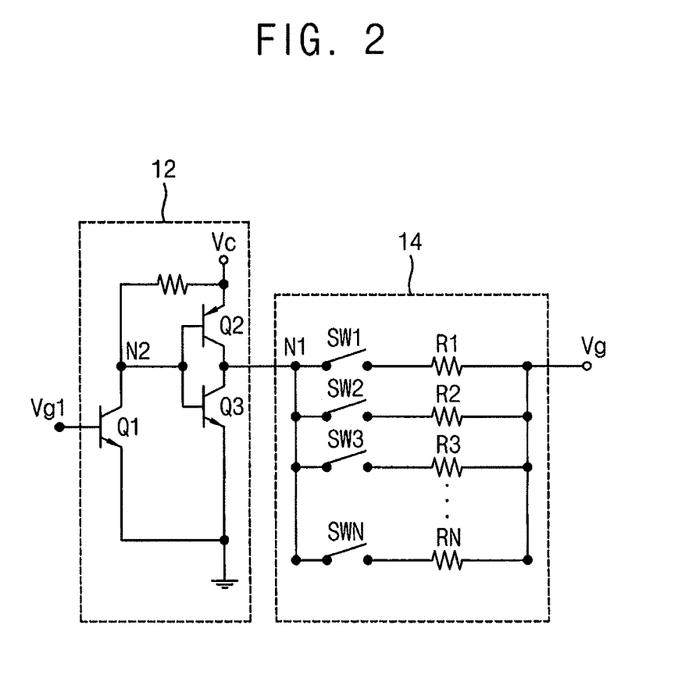
FIG. 2 illustrates an embodiment of a switching controller.

The switching controller 10 has a first end connected to the first output terminal and a second end connected to the control electrode of the power switch S. The switching controller 10 includes the switch gate driver 12 and the slew rate controller 14. The switch gate driver 12 may adjust a level of a first voltage Vg1 having a first cycle Ts to generate a second voltage (e.g. a voltage of a first node N1) having the first cycle Ts.

The switch gate driver 12 may include an inverter Q1 and a buffer Q2 and Q3. A first switching element Q1 of the switch gate driver 12 inverts the first voltage Vg1 using a first DC voltage Vc of a high level and a second DC voltage (e.g. a ground voltage) of a low level. For example, the voltage of a second node N2 may have a phase opposite to a phase of the first voltage Vg1. In addition, the voltage of the second node N2 may have an amplitude greater than an amplitude of the first voltage Vg1.

A second switching element Q2 and a third switching element Q3 buffers the voltage of the second node N2 and outputs the voltage of the second node N2 to the first node N1. The second voltage (the voltage of the first node N1) has the first cycle Ts as the first voltage Vg1.

The first switching element Q1 includes a control electrode to which the first voltage Vg1 is applied, an input electrode connected to the second node N2, and an output electrode to which the second DC voltage (e.g. ground voltage) of the low level is applied.

The second switching element Q2 includes a control electrode connected to the input electrode of the first switching element Q1, an input electrode to which the first DC voltage Vc is applied, and an output electrode connected to an input electrode of the third switching element Q3.

The third switching element Q3 includes a control electrode connected to the input electrode of the first switching element Q1, an input electrode connected to the output electrode of the second switching element Q2, and an output electrode to which the second DC voltage is applied.

The slew rate controller 14 controls a slew rate of a switch voltage Vs at the input electrode of the power switch S to vary according to time. In accordance with at least one embodiment, slew rate refers to an inclination of a waveform of an output signal. The slew rate may correspond to the maximum rate of change of the output signal. When the slew rate of the output signal is large, the output signal increases and decreases at a fast rate. When the slew rate of the output signal is small, the output signal increases and decreases slowly.

If the slew rate of the switch voltage Vs is uniform, broadband power noise may be generated by turning on and off of the power switch S. If the slew rate of the switch voltage Vs varies according to time, the broadband power noise may be reduced when the power switch S is turned on and off.

The slew rate controller 14 of the present exemplary embodiment adjusts the slew rate of the switch voltage Vs to vary according to time to reduce the broadband power noise which is generated by turn on and off of the power switch S.

The slew rate controller 14 may include N resistors R1 to RN which are connected to one another in parallel. N is a positive integer. The N resistors R1 to RN may sequentially connect the switch gate driver 12 to the power switch S by N switches SW1 to SWN respectively connected to the N resistors R1 to RN in series.

Figure 3:
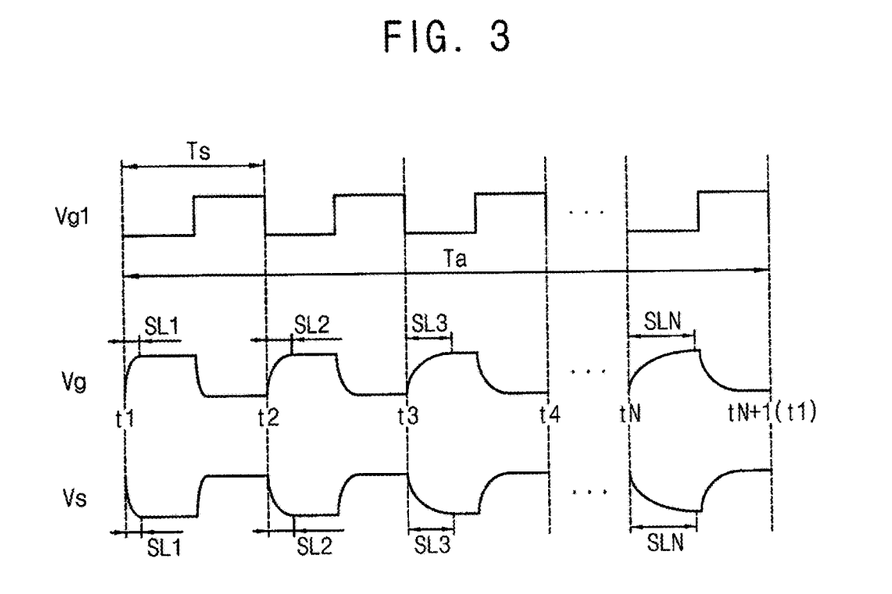
FIG. 3 illustrates examples of input and output signals of the DC-DC converter.

For example, between t1 and t2, a first switch SW1 among the first to N-th switches SW1 to SWN is turned on so that a first resistor R1 connects the switch gate driver 12 to the power switch S.

For example, between t2 and t3, a second switch SW2 among the first to N-th switches SW1 to SWN is turned on so that a second resistor R2 connects the switch gate driver 12 to the power switch S.

For example, between t3 and t4, a third switch SW3 among the first to N-th switches SW1 to SWN is turned on so that a third resistor R3 connects the switch gate driver 12 to the power switch S.

For example, between tN and tN+1, an N-th switch SWN among the first to N-th switches SW1 to SWN is turned on so that an N-th resistor RN connects the switch gate driver 12 to the power switch S.

The N resistors R1 to RN may have resistances different from one another. As the resistance of the resistor of the slew rate controller 14 increases, the slew rate of the switch voltage Vs may decrease.

According to the present exemplary embodiment, the resistance of the second resistor R2 may be greater than the resistance of the first resistor R1. The resistance of the third resistor R3 may be greater than the resistance of the second resistor R2. The resistance of the N-th resistor RN may be greater than the resistance of the third resistor R3.

Accordingly, as shown in FIG. 3, when the first resistor R1 having a relatively minimum resistance is connected between the power switch S and the gate driver 12, an output voltage Vg of the slew rate controller 14 has a relatively high slew rate. Accordingly, the switch voltage Vs has a relatively high slew rate.

When the second resistor R2 having a resistance greater than the first resistor R1 is connected between the power switch S and the gate driver 12, the slew rate of the output voltage Vg decreases. Accordingly, the slew rate of the switch voltage decreases.

When the third resistor R3 having a resistance greater than the second resistor R2 is connected between the power switch S and the gate driver 12, the slew rate of the output voltage Vg decreases. Accordingly, the slew rate of the switch voltage decreases.

When the N-th resistor RN having a relatively maximum resistance is connected between the power switch S and the gate driver 12, the output voltage Vg of the slew rate controller 14 has a minimum slew rate. Accordingly, the switch voltage Vs has a relatively minimum slew rate. Accordingly, the switch voltage Vs has a relatively minimum slew rate.

In the present exemplary embodiment, the first to N-th switches SW1 to SWN are sequentially turned on. After the N-th switch SWN is turned on and off, then the first switch SW1 is turned on.

A slew rate changing cycle Ta may be defined as time from a moment when the first switch SW1 is turned on to a moment when the first switch SW1 is turned on again. In the present exemplary embodiment, the slew rate changing cycle Ta may be greater than the first cycle Ts by N times.

Figure 4:
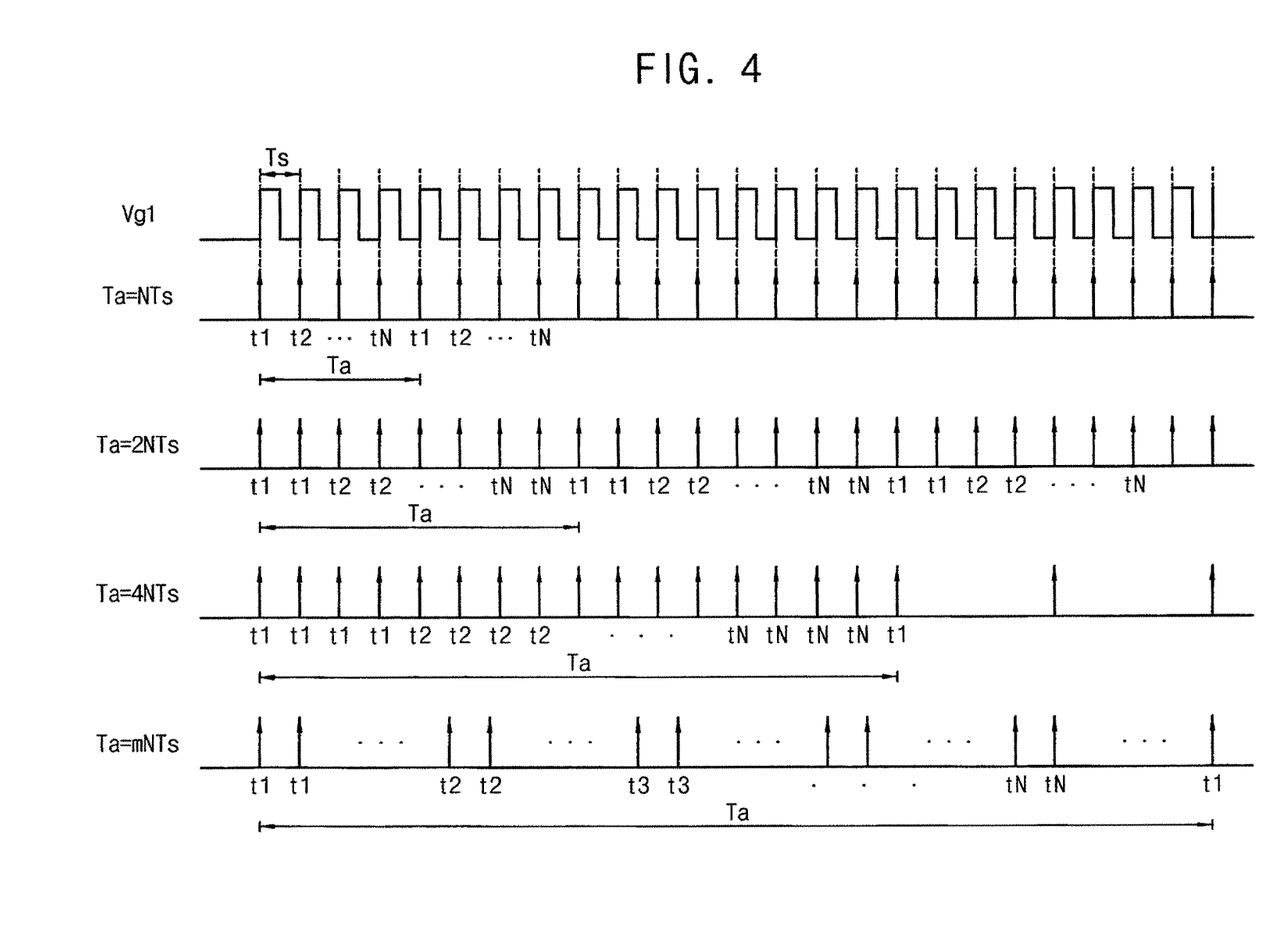
FIG. 4 illustrates examples of an input voltage of a switch gate driver and a slew rate changing cycle of a slew rate controller.

As illustrated in FIG. 4, the slew rate changing cycle Ta may be set to an integer multiple of N of the first cycle Ts. To increase, or maximize, a reduction in broadband noise, the slew rate changing cycle Ta may be set to N times the first cycle Ts. On the other hand, to achieve a lesser degree of reduction in broadband noise, the slew rate changing cycle Ta may be set to 2N times the first cycle Ts, 4N times of the first cycle Ts, or mN times the first cycle Ts, where m is a positive integer. As the slew rate changing cycle Ta increases, the number of switching operations for the first to N-th switches SW1 to SWN is decreased. Thus, power consumption of the slew rate controller 14 may be reduced and the lifetime of the slew rate controller 14 may increase.

In one embodiment, a falling slew rate and a rising slew rate of the switch voltage Vs may not be independently adjusted. For example, the falling slew rate and the rising slew rate may be adjusted in the same ratio. Also, the first switch SW1 of the slew rate controller 14 may be turned on based on a rising edge of a first pulse of the first voltage Vg1, and the second switch SW2 of the slew rate controller 14 may be turned on based on a rising edge of a second pulse of the first voltage Vg1. Alternatively, the first switch SW1 of the slew rate controller 14 may be turned on based on a falling edge of a first pulse of the first voltage Vg1, and the second switch SW2 of the slew rate controller 14 may be turned on based on a falling edge of a second pulse of the first voltage Vg1.

Thus, according to the present exemplary embodiment, the DC-DC converter includes the slew rate controller 14 which generates a voltage having a slew rate which varies according to time, so that broadband power noise may be effectively reduced. In addition, the slew rate of the switch voltage Vs is adjusted by the slew rate controller 14, so that peak band power noise may be reduced or prevented.

Figure 5:
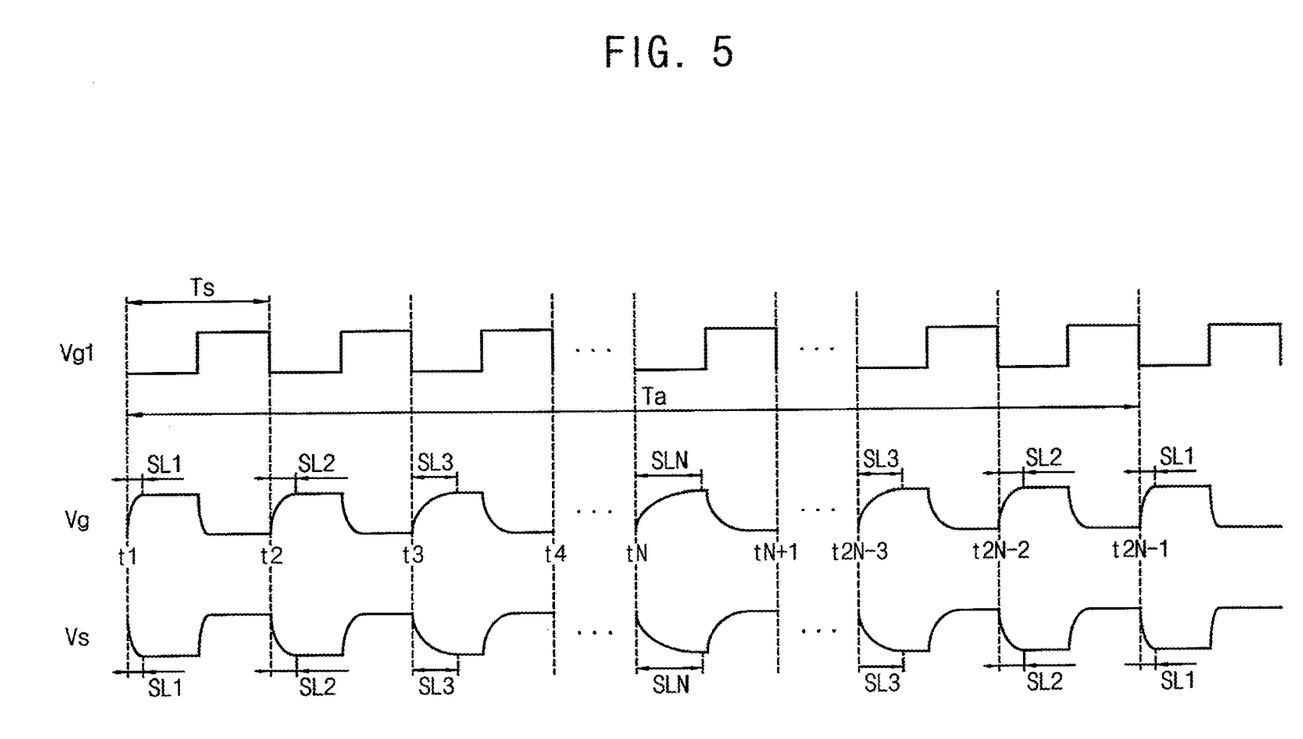
FIG. 5 illustrates examples of input and output signals of a DC-DC converter.

FIG. 5 illustrates examples of input and output signals of a DC-DC converter. The DC-DC converter may be substantially the same as the DC-DC converter of the previous embodiment in FIGS. 1 to 4, except for the slew rate changing cycle.

Referring to FIGS. 1, 2 and 5, the DC-DC converter includes a power switch S and a switching controller 10. The power switch S is repetitively turned on and off to generate an output DC voltage VO based on an input DC voltage VI. The switching controller 10 controls an operation of the power switch S.

The switching controller 10 includes the switch gate driver 12 and the slew rate controller 14. The slew rate controller 14 controls a slew rate of a switch voltage Vs at the input electrode of the power switch S to vary according to time. The slew rate controller 14 adjusts the slew rate of the switch voltage Vs to vary with time in order to reduce broadband power noise generated by turning on and off the power switch S.

The slew rate controller 14 may include N resistors R1 to RN connected to one another in parallel, where N is a positive integer. The N resistors R1 to RN may sequentially connect the switch gate driver 12 to the power switch S by N switches SW1 to SWN, which are respectively connected to the N resistors R1 to RN in series.

Between t1 and t2, a first switch SW1 among the first to N-th switches SW1 to SWN is turned on so that a first resistor R1 connects the switch gate driver 12 to the power switch S.

Between t2 and t3, a second switch SW2 among the first to N-th switches SW1 to SWN is turned on so that a second resistor R2 connects the switch gate driver 12 to the power switch S.

Between t3 and t4, a third switch SW3 among the first to N-th switches SW1 to SWN is turned on so that a third resistor R3 connects the switch gate driver 12 to the power switch S.

Between tN and tN+1, an N-th switch SWN among the first to N-th switches SW1 to SWN is turned on so that an N-th resistor RN connects the switch gate driver 12 to the power switch S.

Between tN+1 and tN+2, an (N−1)-th switch SWN−1 among the first to N-th switches SW1 to SWN is turned on so that an (N−1)-th resistor RN−1 connects the switch gate driver 12 to the power switch S.

Between t2N−3 and t2N−2, the third switch SW3 among the first to N-th switches SW1 to SWN is turned on so that the third resistor R3 connects the switch gate driver 12 to the power switch S.

Between t2N−2 and t2N−1, the second switch SW2 among the first to N-th switches SW1 to SWN is turned on so that the second resistor R2 connects the switch gate driver 12 to the power switch S.

Between t2N−1 and t2N, the first switch SW1 among the first to N-th switches SW1 to SWN is turned on so that the first resistor R1 connects the switch gate driver 12 to the power switch S.

The N resistors R1 to RN may have resistances different from one another. As the resistance of the slew rate controller 14 increases, the slew rate of the switch voltage Vs may decrease.

In the present exemplary embodiment, the first to N-th switches SW1 to SWN are sequentially turned on. After the N-th switch SWN is turned on, then the (N−1)-th to first switches SWN−1 to SW1 are sequentially turned on.

The slew rate changing cycle Ta may be defined as time from a moment when the first switch SW1 is turned on to a moment when the first switch SW1 is turned on again. The slew rate changing cycle Ta may be, for example, greater than the first cycle Ts by 2N−2 times. In one embodiment, the slew rate changing cycle Ta may be set to an integer multiple of 2N−2 of the first cycle Ts, for example, in a similar manner to FIG. 4.

In the present exemplary embodiment, the DC-DC converter includes the slew rate controller 14 which generates a voltage having a slew rate which varies with time, so that broadband power noise may be effectively reduced. In addition, the slew rate of the switch voltage Vs is adjusted by the slew rate controller 14 so that peak band power noise may be reduced or prevented.

Figure 6:
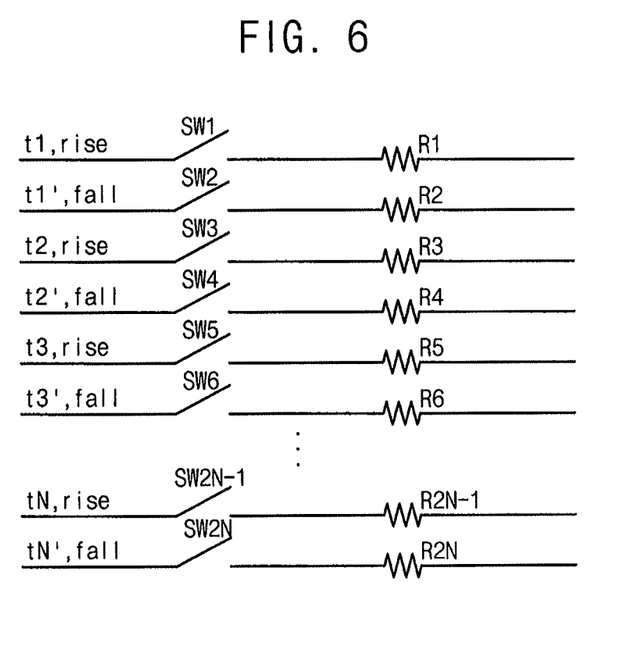
FIG. 6 illustrates an embodiment of a slew rate controller.
Figure 7:
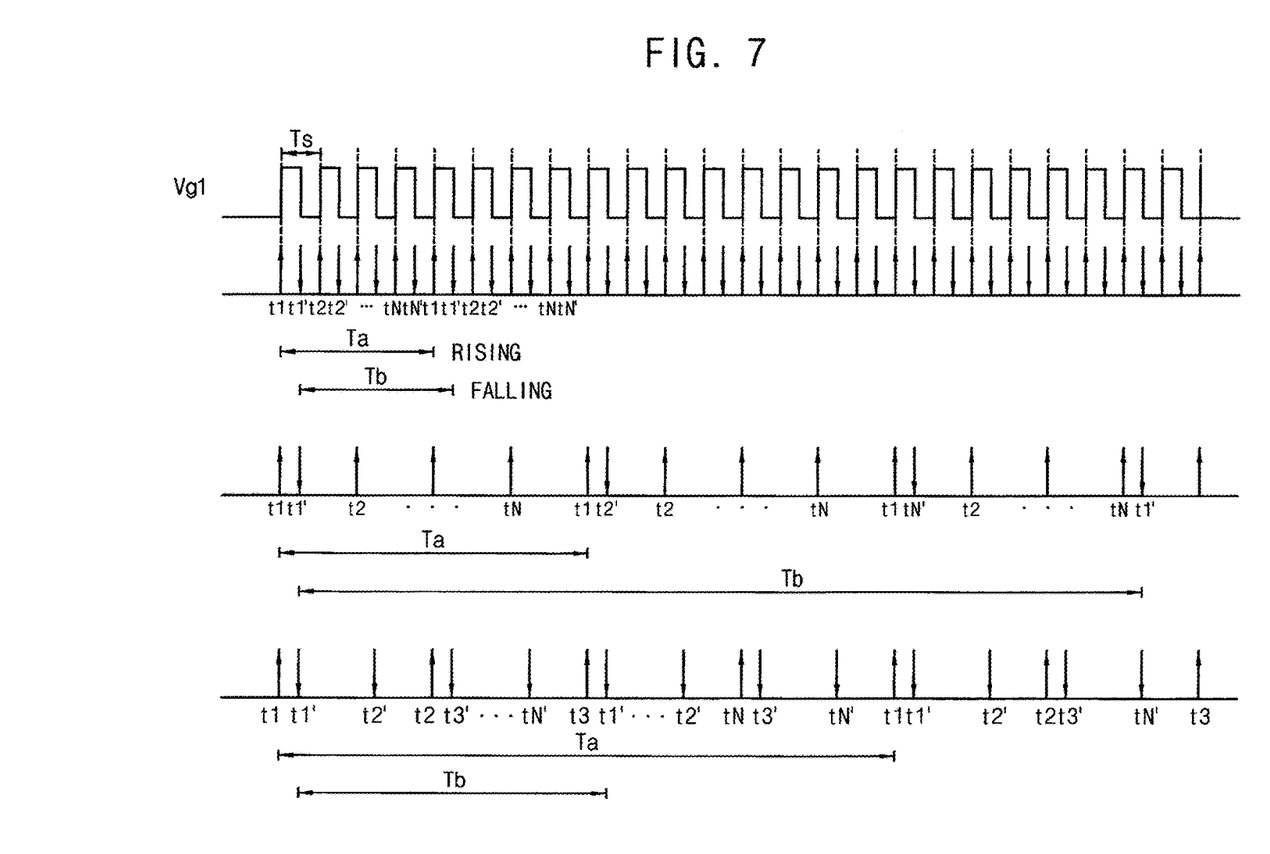
FIG. 7 illustrates examples of an input voltage of a switch gate driver and a slew rate changing cycle of a slew rate controller in FIG. 6.

FIG. 6 illustrates an embodiment of a slew rate controller 14 of a switching controller. FIG. 7 is a timing diagram illustrating an example of a cycle of an input voltage of the switch gate driver 12 and a slew rate changing cycle of the slew rate controller 14 of FIG. 6. In this embodiment, the DC-DC converter may be substantially the same as the DC-DC converter of the embodiment in FIGS. 1 to 4, except that the slew rate controller independently controls the falling slew rate and the rising slew rate.

Referring to FIGS. 1, 2, and 6, the DC-DC converter includes a power switch S and a switching controller 10. The power switch S is repetitively turned on and off to generate an output DC voltage VO based on an input DC voltage VI. The switching controller 10 controls an operation of the power switch S.

The switching controller 10 includes the switch gate driver 12 and the slew rate controller 14. The slew rate controller 14 controls a slew rate of a switch voltage Vs at the input electrode of the power switch S to vary according to time. The slew rate controller 14 adjusts the slew rate of the switch voltage Vs to vary with time, in order to reduce broadband power noise generated by turning on and off the power switch S.

The slew rate controller 14 may include 2N resistors R1 to R2N connected to one another in parallel, where N is a positive integer. The 2N resistors R1 to R2N may sequentially connect the switch gate driver 12 to the power switch S by 2N switches SW1 to SW2N, which are respectively connected to the 2N resistors R1 to R2N in series.

The falling slew rate of the switch voltage Vs and the rising slew rate of the switch voltage Vs are independently adjusted. In one embodiment, the falling slew rate of the switch voltage Vs and the rising slew rate of the switch voltage Vs are adjusted in a different ratio. For example, the first switch SW1 of the slew rate controller 14 may be turned on based on a rising edge of a first pulse of the first voltage Vg1, and the second switch SW2 of the slew rate controller 14 may be turned on based on a falling edge of the first pulse of the first voltage Vg1.

Additionally, or alternatively, the turn-on repeating cycle Ta of a first switch group SW1, SW3, . . . , SW2N−1, which are turned on in response to rising edges of pulses of the first voltage Vg1, may be different from the turn-on repeating cycle Tb of a second switch group SW2, SW4, . . . , SW2N, which are turned on in response to falling edges of pulses of the first voltage Vg1.

In the first example in FIG. 7, the rising slew rate changing cycle Ta from t1 to next t1 is same as the falling slew rate changing cycle Tb from t1' to next t1'. From t1 to t1', the first switch SW1 is turned on. From t1' to t2, the second switch SW2 is turned on. From t2 to t2', the third switch SW3 is turned on.

In the second example in FIG. 7, the falling slew rate changing cycle Tb from t1' to next t1' is greater than the rising slew rate changing cycle Ta from t1 to next t1. From t1 to t1', the first switch SW1 is turned on. From t1' to t2, the second switch SW2 is turned on. From t2 to t3, the third switch SW3 is turned on.

In the third example in FIG. 7, the rising slew rate changing cycle Ta from t1 to next t1 is greater than the falling slew rate changing cycle Tb from t1' to next t1'. From t1 to t1', the first switch SW1 is turned on. From t1' to t2', the second switch SW2 is turned on. From t2' to t2, the fourth switch SW4 is turned on. From t2 to t3', the third switch SW3 is turned on.

Thus, in this embodiment, the falling slew rate and the rising slew rate of the switch voltage Vs are therefore independently controlled in various ways. The slew rate controller 14 may generate a voltage having a slew rate that varies with time to reduce broadband power noise. The slew rate of the switch voltage Vs may be adjusted by the slew rate controller 14 to reduce or prevent peak band power noise. Also, the falling slew rate (which may be related to broadband noise to a greater degree) may be adjusted to vary with time and the rising slew rate may not be adjusted to vary with time.

Figure 8:
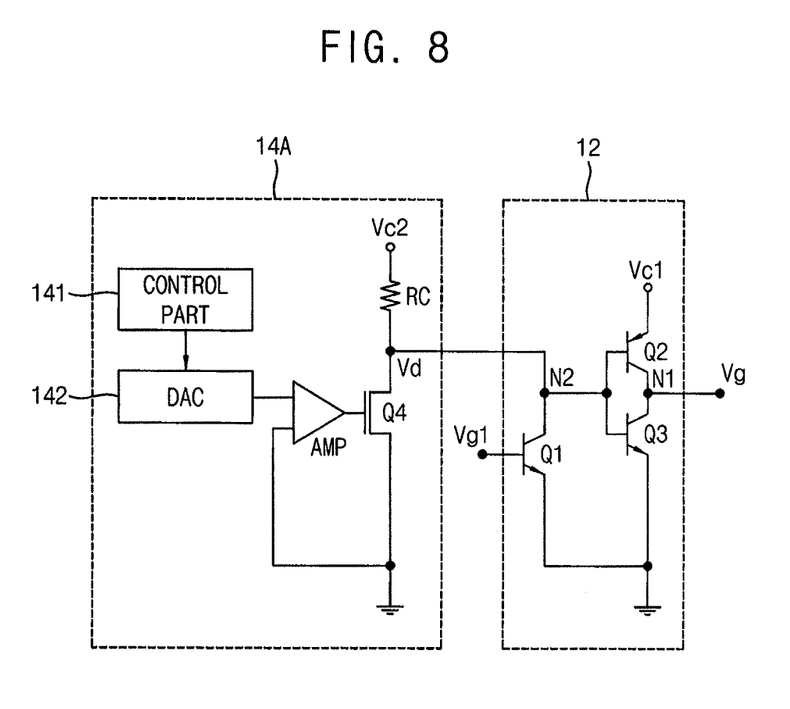
FIG. 8 illustrates another embodiment of a switching controller.
Figure 9:
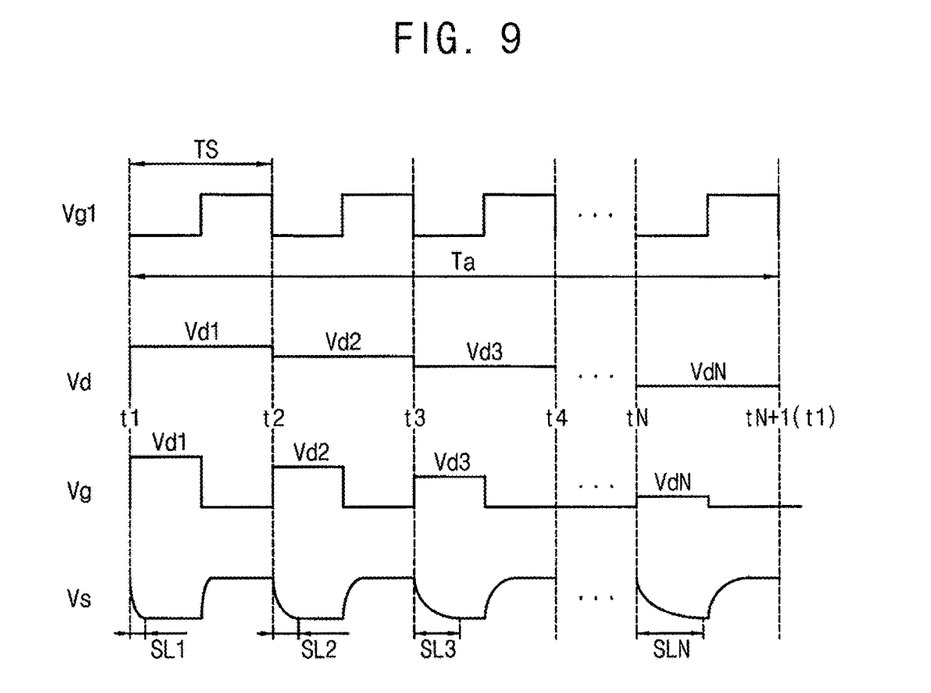
FIG. 9 illustrates examples of input and output signals of the DC-DC converter in FIG. 8.

FIG. 8 illustrates an embodiment of a switching controller of a DC-DC converter. FIG. 9 is a timing diagram illustrating an example of input and output signals of the DC-DC converter in FIG. 8. The DC-DC converter may be substantially the same as the DC-DC converter of the embodiment in FIGS. 1 to 4, except for the structure and operation of the slew rate controller.

Referring to FIGS. 1, 8 and 9, the DC-DC converter includes a power switch S and a switching controller 10. The power switch S is repetitively turned on and off to generate an output DC voltage VO based on an input DC voltage VI. The switching controller 10 controls an operation of the power switch S.

The switching controller 10 includes the switch gate driver 12 and the slew rate controller 14A. The switch gate driver 12 may adjust a level of a first voltage Vg1 having a first cycle Ts to generate a second voltage (e.g. a voltage of a first node N1) having the first cycle Ts. The switch gate driver 12 may include an inverter Q1 and a buffer Q2 and Q3. A first switching element Q1 of the switch gate driver 12 inverts the first voltage Vg1 using a variable power voltage Vd output from the slew rate controller 14A and a second DC voltage (e.g. a ground voltage) of a low level. For example, the voltage of a second node N2 may have a phase opposite to a phase of the first voltage Vg1. In addition, the voltage of the second node N2 may have an amplitude greater than an amplitude of the first voltage Vg1.

A second switching element Q2 and a third switching element Q3 buffers the voltage of the second node N2 and outputs the voltage of the second node N2 to the first node N1. The second voltage (the voltage of the first node N1) has the first cycle Ts as the first voltage Vg1.

The first switching element Q1 includes a control electrode to which the first voltage Vg1 is applied, an input electrode to which the variable power voltage Vd is applied, and an output electrode to which the second DC voltage (e.g. the ground voltage) of the low level is applied.

The second switching element Q2 includes a control electrode connected to the input electrode of the first switching element Q1, an input electrode to which a first DC voltage Vc1 of a high level is applied, and an output electrode connected to an input electrode of the third switching element Q3.

The third switching element Q3 includes a control electrode connected to the input electrode of the first switching element Q1, an input electrode connected to the output electrode of the second switching element Q2, and an output electrode to which the second DC voltage is applied.

The slew rate controller 14A controls a slew rate of a switch voltage Vs at the input electrode of the power switch S to vary according to time. The slew rate controller 14A of the present exemplary embodiment adjusts the slew rate of the switch voltage Vs to vary with time, in order to reduce broadband power noise generated by turning on and off the power switch S.

The slew rate controller 14A generates the variable power voltage Vd having various levels according to an input signal. The slew rate controller 14A may include a control part 141, a digital to analog converter ("DAC") 142, an amplifier AMP, and a fourth switching element Q4. The control part 141 may generate the input signal and output the input signal to the digital-to-analog converter 142. As with the slew rate controller and the switching controller, as well as other processing features of the embodiments described herein, the control part 141 may include logic implemented hardware, software, or both. In one embodiment, the control part 141 may be a microprocessor, computer, processing structure, or controller. In one embodiment, the control part may be connected to a memory that stores firmware, middleware, or other code or set of instructions for generating the input signal for input to the digital-to-analog converter 142.

The digital-to-analog converter 142 generates an input analog signal based on the input signal from the control part 141. The amplifier AMP may be connected to the digital-to-analog converter 142. The fourth switching element Q4 may be connected to the amplifier AMP.

A first input electrode of the amplifier AMP may be connected to an output terminal of the digital-to-analog converter 142. A power voltage, for example, of a low level (e.g. a ground voltage) may be applied to a second input electrode of the amplifier AMP. An output electrode of the amplifier AMP may be connected to a control electrode of the fourth switching element Q4.

An input electrode of the fourth switching element Q4 may be connected to a first end of a load resistor RC. A third DC voltage of a high level may be applied to a second end of the load resistor RC.

When the first voltage Vg1 of the switch gate driver 12 has a low level, the voltage of the second node N2 has a level of the variable power voltage Vd. When the first voltage Vg1 of the switch gate driver 12 has a high level, the voltage of the second node N2 has a low level.

The voltage of the second node N2 is buffered and transmitted to the first node N1. The voltage Vg of the first node N1 may have a waveform substantially the same as a waveform of the voltage of the second node N2. The voltage Vg of the first node N1 is applied to a control electrode of the power switch S. When a high level of the voltage Vg of the first node N1 has a relatively high value, the slew rate of the switch voltage Vs of the power switch S is relatively high.

In FIG. 9, between t1 and t2, the voltage Vg of the first node N1 has a predetermined (e.g., high or maximum) level Vd1. Thus, the slew rate of the switch voltage is large or the greatest.

Between t2 and t3, the high level of the voltage Vg of the first node N1 decreases from Vd1 to Vd2. Thus, the slew rate of the switch voltage Vs decreases.

Between t3 and t4, the high level of the voltage Vg of the first node N1 decreases from Vd2 to Vd3. Thus, the slew rate of the switch voltage Vs decreases.

Between tN and tN+1, the voltage Vg of the first node N1 has a minimum high level VdN. Thus, the slew rate of the switch voltage Vs is low or a least value.

In the present exemplary embodiment, the level of the variable power voltage Vd sequentially decreases from the first level Vd1 to the N-th level VdN. After the level of the variable power voltage Vd reaches the N-th level VdN, the level of the variable power voltage Vd increases to the first level Vd1.

The slew rate changing cycle Ta may be defined as time from a moment when the variable power voltage Vd is on the first level Vd1 to a moment when the variable power voltage Vd is on the first level Vd1 again after decreasing to the N-th level VdN. In the present exemplary embodiment, the slew rate changing cycle Ta may be greater than the first cycle Ts by N times. In one embodiment, the slew rate changing cycle Ta may be set to an integer multiple of N of the first cycle Ts, for example, in a similar manner to FIG. 4.

According to the present exemplary embodiment, the DC-DC converter includes the slew rate controller 14A which generates a voltage having a slew rate that varies with time, so that broadband power noise may be effectively reduced. In addition, the slew rate of the switch voltage Vs is adjusted by the slew rate controller 14A so that peak band power noise may be reduced or prevented.

Figure 10:
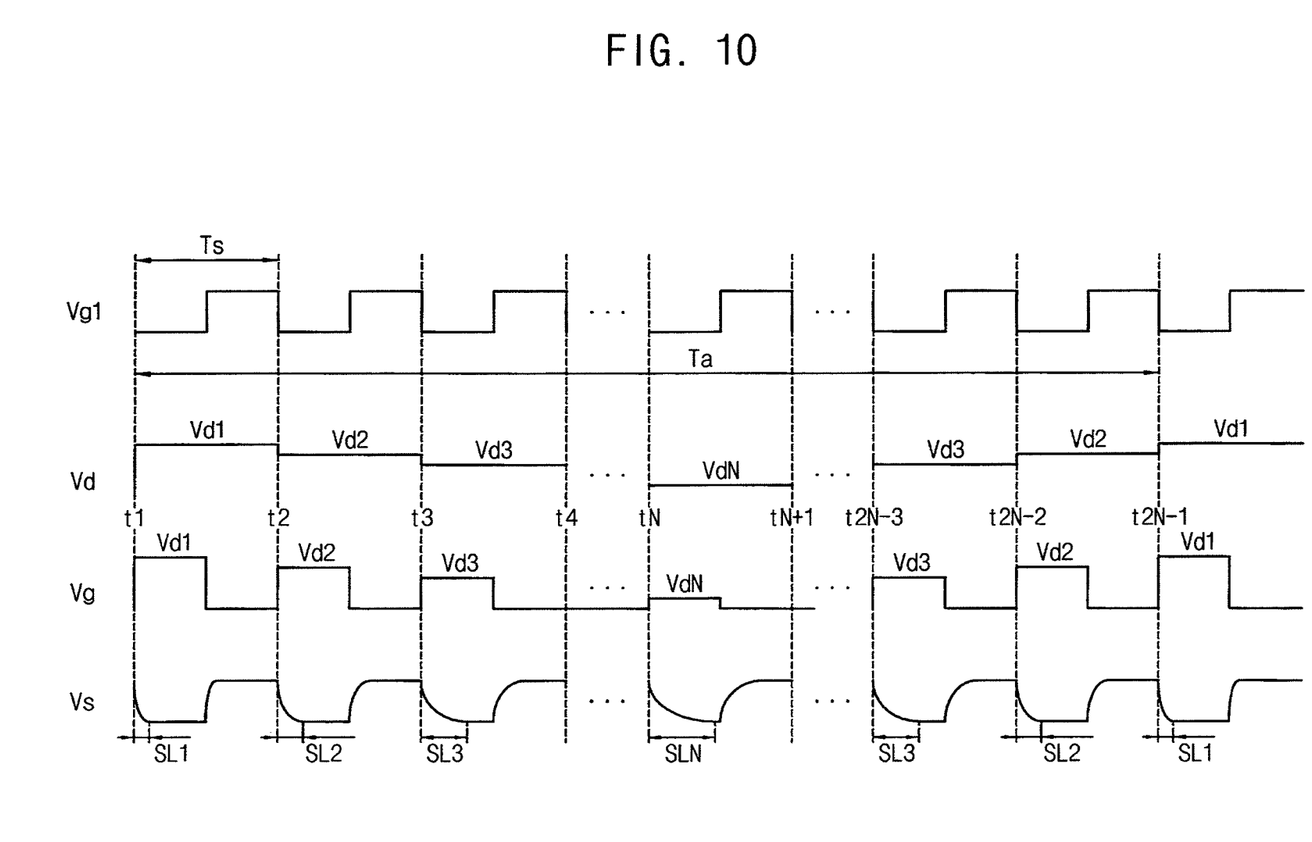
FIG. 10 illustrates examples of input and output signals of a DC-DC converter.

FIG. 10 is a timing diagram illustrating additional examples of input and output signals of a DC-DC converter. The DC-DC converter may be substantially the same as the DC-DC converter of the embodiment in FIGS. 8 and 9, except for the slew rate changing cycle.

Referring to FIGS. 1, 8, and 10, the DC-DC converter includes a power switch S and a switching controller 10. The power switch S is repetitively turned on and off to generate an output DC voltage VO based on an input DC voltage VI. The switching controller 10 controls an operation of the power switch S.

The switching controller 10 includes the switch gate driver 12 and the slew rate controller 14A. The slew rate controller 14A controls a slew rate of a switch voltage Vs at the input electrode of the power switch S to vary according to time. The slew rate controller 14A adjusts the slew rate of the switch voltage Vs to vary according to time, in order to reduce broadband power noise generated by turning on and off power switch S.

The slew rate controller 14A generates the variable power voltage Vd having various levels according to an input signal. The slew rate controller 14A may be structurally similar to the arrangement in FIG. 8. For example, the slew rate controller 14A may include the control part 141, the digital-to-analog converter ("DAC") 142, the amplifier AMP, and the fourth switching element Q4. The control part 141 generates the input signal and outputs the input signal to the digital-to-analog converter 142. The digital-to-analog converter 142 receives the input signal and generates an input analog signal. The amplifier AMP may be connected to the digital-to-analog converter 142. The fourth switching element Q4 may be connected to the amplifier AMP.

In FIG. 10, between t1 and t2, the voltage Vg of the first node N1 has a maximum high level Vd1. Thus, the slew rate of the switch voltage may be high or the greatest.

Between t2 and t3, the high level of the voltage Vg of the first node N1 decreases from Vd1 to Vd2. Thus, the slew rate of the switch voltage Vs decreases.

Between t3 and t4, the high level of the voltage Vg of the first node N decreases from Vd2 to Vd3. Thus, the slew rate of the switch voltage Vs decreases.

Between tN and tN+1, the voltage Vg of the first node N1 has a low or minimum level VdN. Thus, the slew rate of the switch voltage Vs is low or the least.

Between tN+1 and tN+2, the high level of the voltage Vg of the first node N1 increases from VdN to VdN−1. Thus, the slew rate of the switch voltage Vs increases.

Between t2N−3 and t2N−2, the high level of the voltage Vg of the first node N1 increases to Vd3. Thus, the slew rate of the switch voltage Vs increases.

Between t2N−2 and t2N−1, the high level of the voltage Vg of the first node N1 increases from Vd3 to Vd2. Thus, the slew rate of the switch voltage Vs increases.

Between t2N−1 and t2N, the high level of the voltage Vg of the first node N1 increases from Vd2 to Vd1 which is a higher or maximum high level. Thus, the slew rate of the switch voltage Vs is high or the greatest.

In the present exemplary embodiment, the level of the variable power voltage Vd sequentially decreases from the first level Vd1 to the N-th level VdN. After the level of the variable power voltage Vd reaches the N-th level VdN, the level of the variable power voltage Vd sequentially increases from (N−1)-th level VdN−1 to first level Vd1.

The slew rate changing cycle Ta may be defined as time from a moment when the variable power voltage Vd is on the first level Vd1 to a moment when the variable power voltage Vd is on the first level Vd1 again after decreasing to the N-th level VdN. For example, the slew rate changing cycle Ta may be greater than the first cycle Ts by 2N−2 times. In one embodiment, the slew rate changing cycle Ta may be set to an integer multiple of 2N−2 of the first cycle Ts, for example, in a similar manner to FIG. 4.

According to the present exemplary embodiment, the DC-DC converter includes slew rate controller 14A which generates a voltage having a slew rate which varies with time, so that broadband power noise may be effectively reduced. In addition, the slew rate of the switch voltage Vs is adjusted by the slew rate controller 14A so that peak band power noise may be reduced or prevented.

Figure 11:
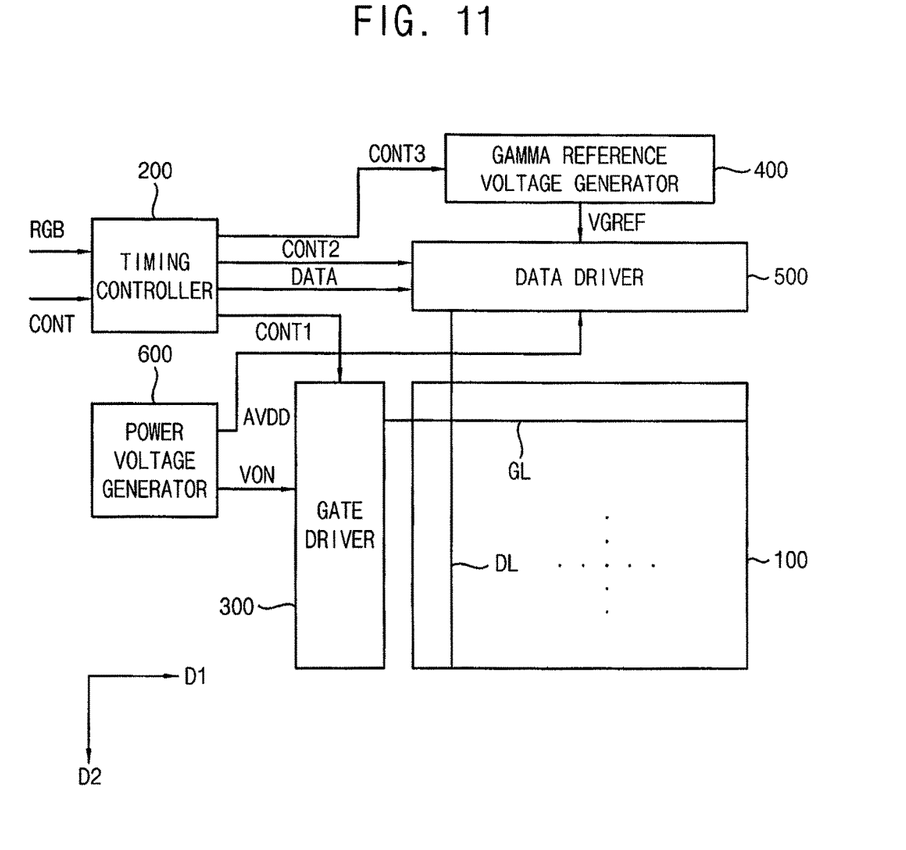
FIG. 11 illustrates an embodiment of a display apparatus.

FIG. 11 illustrates an embodiment of a display apparatus which includes a display panel 100 and a panel driver. The panel driver includes a timing controller 200, a gate driver 300, a gamma reference voltage generator 400, a data driver 500, and a power voltage generator 600.

The display panel 100 has a display region on which an image is displayed and a peripheral region adjacent to the display region. The display panel 100 includes a plurality of gate lines GL, a plurality of data lines DL, and a plurality of pixels connected to the gate lines GL and the data lines DL. The gate lines GL extend in a first direction D1 and the data lines DL extend in a second direction D2 crossing the first direction D1.

Each pixel may include, for example, a switching element, a liquid crystal capacitor, and a storage capacitor. The liquid crystal capacitor and the storage capacitor are electrically connected to the switching element. The pixels may be in a matrix form.

The timing controller 200 receives input image data RGB and an input control signal CONT from an external apparatus. The input image data may include, for example, red image data R, green image data G and blue image data B. The input control signal CONT may include a master clock signal and a data enable signal. The input control signal CONT may further include a vertical synchronizing signal and a horizontal synchronizing signal.

The timing controller 200 generates a first control signal CONT1, a second control signal CONT2, a third control signal CONT3, and a data signal DATA based on the input image data RGB and the input control signal CONT.

The timing controller 200 generates the first control signal CONT1 for controlling an operation of the gate driver 300 based on the input control signal CONT, and outputs the first control signal CONT1 to the gate driver 300. The first control signal CONT1 may further include a vertical start signal and a gate clock signal.

The timing controller 200 generates the second control signal CONT2 for controlling an operation of the data driver 500 based on the input control signal CONT, and outputs the second control signal CONT2 to the data driver 500. The second control signal CONT2 may include a horizontal start signal and a load signal.

The timing controller 200 generates the data signal DATA based on the input image data RGB. The timing controller 200 outputs the data signal DATA to the data driver 500.

The timing controller 200 generates the third control signal CONT3 for controlling operation of the gamma reference voltage generator 400 based on the input control signal CONT, and outputs the third control signal CONT3 to the gamma reference voltage generator 400.

The gate driver 300 generates gate signals driving the gate lines GL based on the first control signal CONT1 from the timing controller 200. The gate driver 300 sequentially outputs the gate signals to the gate lines GL.

The gamma reference voltage generator 400 generates a gamma reference voltage VGREF based on the third control signal CONT3 from the timing controller 200. The gamma reference voltage generator 400 provides the gamma reference voltage VGREF to the data driver 500. The gamma reference voltage VGREF has a value corresponding to a level of the data signal DATA. The gamma reference voltage generator 400 may be, for example, in the timing controller 200 or the data driver 500.

The data driver 500 receives the second control signal CONT2 and the data signal DATA from the timing controller 200, and receives the gamma reference voltages VGREF from the gamma reference voltage generator 400. The data driver 500 converts the data signal DATA into analog data voltages using the gamma reference voltages VGREF. The data driver 500 outputs the data voltages to the data lines DL.

The power voltage generator 600 may include the DC-DC converter which, for example, corresponds to any of the embodiments in FIGS. 1 to 10. The DC-DC converter includes a power switch S and a switching controller 10. The power switch S is repetitively turned on and off to generate an output DC voltage VO based on an input DC voltage VI. The switching controller 10 controls an operation of the power switch S.

The output DC voltage VO may be, for example, a gate on voltage VON which defines a high level of the gate signal. The gate driver 300 generates the gate signal based on the gate on voltage VON and outputs the gate signal to the gate line GL of the display panel 100.

The output DC voltage VO may be, for example, an analog high power voltage AVDD to generate the data voltage. The data driver 500 generates the data voltage using the analog high power voltage AVDD and outputs the data voltage to the data line DL of the display panel 100.

According to the present exemplary embodiment, the DC-DC converter includes the slew rate controller 14 and 14*a* for generating a voltage having a slew rate which varies according to time, so that broadband power noise may be effectively reduced. In addition, the slew rate of the switch voltage Vs is adjusted by the slew rate controller 14 and 14*a* so that a peak band power noise may be reduced or prevented.

By way of summation and review, a DC-DC converter may experience broadband power noise caused by various influences. For example, rising noise and falling noise may occur when a switch of the DC-DC converter is turned on and off. Various attempts have been made to offset noise in. For example, a snubber circuit may be connected to ends of the switch. Such a circuit might reduce the amplitude of a ring waveform generated when the switch turned on and off. However, the snubber circuit increases the number of elements of the converter and thus the efficiency of the DC-DC converter may be reduced.

In accordance with one or more of the aforementioned embodiments, a DC-DC converter includes a slew rate controller which generates a voltage having a slew rate that varies with time, so that broadband power noise may be effectively reduced. In addition, the slew rate of the switch voltage Vs may be adjusted by the slew rate controller to reduce or prevent peak band power noise.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the present invention as set forth in the following claims.

What is claimed is:

1. A DC-DC converter, comprising:
   a power switch to be repetitively turned on and off to generate an output DC voltage based on an input DC voltage; and
   a switching controller to control operation of the power switch over a plurality of repeating time periods within a slew rate changing cycle, wherein the switching controller includes a slew rate controller to adjust a slew rate of a switch voltage of an electrode of the power switch to vary with different slew rates over the plurality of repeating time periods.

2. The converter as claimed in claim 1, wherein the switching controller includes a switch gate driver to adjust a level of a first voltage having a first cycle to generate a second voltage having the first cycle.

3. The converter as claimed in claim 2, wherein the slew rate of the switch voltage decreases with an increase in a resistance of a resistor of the slew rate controller which connects the switch gate driver to the power switch.

4. The converter as claimed in claim 2, wherein:
   the slew rate controller includes N resistors connected one another in parallel, and
   the N resistors sequentially connect the switch gate driver to the power switch by N switches respectively connected to the N resistors, where N being a positive integer.

5. The converter as claimed in claim 4, the N resistors have different resistances.

6. The converter as claimed in claim 4, wherein:
   first to N-th switches of the slew rate controller are sequentially turned on, and
   after the N-th switch is turned on, the first switch of the slew rate controller is turned on, wherein:
   the slew rate changing cycle corresponds to time from a moment when the first switch is turned on to a moment when the first switch is turned on again, and
   the slew rate changing cycle is greater than the first cycle by N times.

7. The converter as claimed in claim 4, wherein:
   first to N-th switches of the slew rate controller are sequentially turned on, and
   after the N-th switch is turned on, (N−1)-th to the first switches of the slew rate controller are sequentially turned on, wherein:
   the slew rate changing cycle corresponds to a time from a moment when the first switch is turned on to a moment when the first switch is turned on again, and
   the slew rate changing cycle is greater than the first cycle by 2N−2 times.

8. The converter as claimed in claim 4, wherein:
   a first switch of the slew rate controller is turned on based on a rising edge of a first pulse of the first voltage, and a second switch of the slew rate controller is turned on based on a rising edge of a second pulse of the first voltage.

9. The converter as claimed in claim 4, wherein:
a first switch of the slew rate controller is turned on based on a rising edge of a first pulse of the first voltage, and
a second switch of the slew rate controller is turned on based on a falling edge of the first pulse of the first voltage.

10. The converter as claimed in claim 9, wherein:
a first switch group including switches to be turned on based on rising edges of pulses of the first voltage has a first turn-on repeating cycle,
a second switch group including switches to be turned on based on falling edges of pulses of the first voltage has a second turn-on repeating cycle, and
the first turn-on repeating cycle is different from the second turn-on repeating cycle.

11. The converter as claimed in claim 4, wherein:
the switch gate driver includes a first switch, a second switch, and a third switch,
the first switch includes a control electrode to which the first voltage is applied, an input electrode connected to a control electrode of the second switch, and an output electrode to which a second DC voltage of a first level is applied,
the second switch includes the control electrode connected to the input electrode of the first switch, an input electrode to which a first DC voltage of a second level is applied, and an output electrode connected to an input electrode of the third switch, the second level greater than the first level, and
the third switch includes a control electrode connected to the input electrode of the first switch, the input electrode connected to the output electrode of the second switch, and an output electrode to which the second DC voltage is applied.

12. The converter as claimed in claim 2, wherein the slew rate controller is to generate a variable power voltage having various levels according to an input signal.

13. The converter as claimed in claim 12, wherein the slew rate controller includes:
an digital-to-analog converter to receive the input signal and to generate an input analog signal;
an amplifier connected to the digital to analog converter; and
a fourth switch connected to the amplifier.

14. The converter as claimed in claim 12, wherein the slew rate of the switch voltage increases as the variable power voltage increases.

15. The converter as claimed in claim 12, wherein:
the variable power voltage sequentially decreases from a first level to an N-th level, and
after the level of the variable power voltage reaches the N-th level, the level of the variable power voltage increases to the first level, wherein:
the slew rate changing cycle corresponds to a time from a moment when the variable power voltage is on the first level to a moment when the variable power voltage is on the first level again after decreasing to the N-th level, and
the slew rate changing cycle is greater than the first cycle by N times.

16. The converter as claimed in claim 12, wherein:
the variable power voltage sequentially decreases from a first level to an N-th level, and
after the level of the variable power voltage reaches the N-th level, the level of the variable power voltage sequentially increases from an (N−1)-th level to the first level, wherein:
the slew rate changing cycle corresponds to a time from a moment when the variable power voltage is on the first level to a moment when the variable power voltage is on the first level again after decreasing to the N-th level, and
the slew rate changing cycle is greater than the first cycle by 2N−2 times.

17. The converter as claimed in claim 12, wherein:
the switch gate driver includes a first switch, a second switch, and a third switch,
the first switch includes a control electrode to which the first voltage is applied, an input electrode to which the variable power voltage is applied, and an output electrode to which a second DC voltage of a first level is applied,
the second switch includes a control electrode connected to the input electrode of the first switch, an input electrode to which a first DC voltage of a second level is applied, and an output electrode connected to an input electrode of the third switch, the second level higher than the first level, and
the third switch includes a control electrode connected to the input electrode of the first switch, the input electrode connected to the output electrode of the second switch, and an output electrode to which the second DC voltage is applied.

18. A display apparatus, comprising:
a display panel to display an image;
a DC-DC converter including a power switch and a switching controller, the power switch to be repetitively turned on and off to generate an output DC voltage based on an input DC voltage, and the switching controller to control operation of the power switch over a plurality of repeating time periods within a slew rate changing cycle; and
a display panel driver to drive the display panel based on the output DC voltage, wherein the switching controller includes a slew rate controller to adjust a slew rate of a switch voltage of an electrode of the power switch to vary with different slew rates over the plurality of repeating time periods.

19. The display apparatus as claimed in claim 18, wherein the display panel driver includes a gate driver to output a gate signal to a gate line of the display panel, the output DC voltage of the DC-DC converter corresponding to a gate-on voltage.

20. The display apparatus as claimed in claim 18, wherein:
the display panel driver includes a data driver to output a data voltage to a data line of the display panel, and
the output DC voltage of the DC-DC converter corresponds to an analog power voltage to generate the data voltage.

* * * * *